May 23, 1961 F. E. BLOUNT 2,985,769

FAST RESPONSE GATING CIRCUIT

Filed April 25, 1956 2 Sheets-Sheet 1

INVENTOR
F. E. BLOUNT
BY Harold C. Herman
ATTORNEY

May 23, 1961
F. E. BLOUNT
2,985,769
FAST RESPONSE GATING CIRCUIT
Filed April 25, 1956
2 Sheets-Sheet 2

| VOLTAGE CONDITIONS | | | | |
|---|---|---|---|---|
| | (1) DISABLED | (2) ENABLED | (3) ON | (4) OFF |
| A | 0 | -10 | -10 | -10 |
| B | -12 | -4.5 | -6 | -4.5 |
| C | 0 | 0 | -6 | 0 |
| D | -13.2 | -13.2 | -4.5 | -4.5 |
| E | -12 | -12 | -30 | -30 |

INVENTOR
F. E. BLOUNT
BY
Harold C. Herman
ATTORNEY 2,985,769

FAST RESPONSE GATING CIRCUIT

Frank E. Blount, Cedar Grove, N.J., assignor to Bell Telephone Laboratories, Incorporated, New York, N.Y., a corporation of New York Filed Apr. 25, 1956, Ser. No. 580,630

10 Claims. (Cl. 307—88.5)

This invention relates to pulse amplifiers and more particularly to bistable transistor pulse amplifiers.

A bistable amplifier is an amplifier which has two equilibrium conditions and which can be triggered or shifted from one of the equilibrium conditions to the other. Devices such as transistors, which have a current amplification factor greater than one, lend themselves to bistable amplifier applications. Such amplifiers are described, for example, in the Patent 2,579,336 issued to A. J. Rack on December 18, 1951, and in Patent 2,831,983 issued to B. Ostendorf, Jr., on April 22, 1958.

There are essentially two general types of transistors which are utilized in pulse amplifiers; point contact transistors, which have a current amplification factor greater than one, and junction transistors. Both types of transistors have a base electrode, an emitter electrode and a collector electrode. The base electrode of the point contact transistor is in large area, low resistance contact with a block of semiconductive material; while the emitter and collector electrodes of the point contact transistor are in rectifying contact with the block of semiconductive material. The semiconductive material may be of the n-type having an excess of electrons, or may be of the p-type having an excess of "holes." The junction transistor may be of the p-n-p type or the n-p-n type having a single crystal, with one type of material in the center and the other type on both sides. The base electrode of the junction transistor is connected to the central material and the emitter and collector electrodes of the junction transistor are connected, respectively, to the ends or side materials.

In the above-identified disclosures by Rack and Ostendorf, the bistable amplifiers utilize a single point contact transistor which has a current amplification factor greater than one. When a single transistor is utilized, the current amplification factor must be greater than one to provide for the bistability. When high currents are to be handled, however, point contact transistors are not utilized because the rectifying contacts at the emitter and collector electrodes limit the current handling capacity of the transistor. Junction transistors can handle higher currents than point contact transistors but are not as fast.

Point contact transistors are faster than junction transistors essentially because of three factors:

(1) In point contact transistors, the minority carriers are aided in transit by an electric field set up by the collector current through the point contact, whereas the transport, or transit, time across the base layer of a junction transistor is determined almost exclusively by the relatively slow diffusion of the minority carriers. The transport mechanism of the point contact transistor is sufficiently aided by the attracting field to provide for faster operation even for equal spacing across the base layer;

(2) In point contact transistors, the emitter and collector capacitances are relatively unimportant because the areas of the rectifying junctions are small. In junction transistors a considerable reactive effect is introduced by the large junction areas; and (3) In point contact transistors, the end areas may be spaced closer together because it is not necessary to connect a base lead to a central area in the manner required in constructing a junction transistor. The reaction speed of a transistor is directly related to the end area spacing.

In addition to these three factors, the operating speed of both types of transistors is affected by a "storage time" delay. When a "saturated" transistor is turned off, the output current remains constant for a certain period of time because of minority carrier storage. During this interval, the minority carriers stored in the base layer flow at a rate which is limited by the circuit resistance. Not until the minority carrier density in the base layer adjacent the collector junction has been reduced to zero does the decay of the circuit current commence. When the carrier density near the collector junction approaches zero, the collector junction impedance increases rapidly and the transistor begins to react with its active region parameters. When a transistor is switched, therefore, from a saturation condition, it must first pass through a storage time interval before the decay of the collector current commences. The carrier storage effects may prolong the turning off of the transistor by a factor as large as ten.

It is a general object of this invention to provide a low cost, fast operating transistor pulse amplifier which has a high-current handling capacity.

Another object of this invention is to materially reduce the storage time delay in turning off a transistor amplifier.

These and other objects of this invention are attained in an illustrative embodiment wherein the bistable amplifier includes a point contact transistor and a junction transistor. The point contact transistor is switched to a high-current condition in order to turn off the high-current output of the bistable amplifier.

A feature of this invention relates to the provision of a bistable transistor circuit having a point contact transistor which provides for the bistability and for rapid switching, and a junction transistor which provides for high-current handling capacity from a high voltage supply source.

Another feature of this invention pertains to means for rapidly reducing the impedance in the base-to-collector path of a junction transistor to reduce the storage time delay in turning off the transistor. The means for rapidly reducing the impedance includes the fast-acting point contact transistor. To reduce the impedance, the point contact transistor is turned on, instead of off, in order to avoid a storage time delay in the point contact transistor.

Still another feature of this invention relates to switching a current back and forth between the point contact transistor and the junction transistor. When the bistable amplifier output current is turned off, the base current of the junction transistor is switched to become the collector current of the point contact transistor. Emitter biasing instead of base biasing is utilized to decrease the difference in potential at the point contact collector electrode between the conducting and nonconducting conditions of the point contact transistor. In this manner, delays due to substantial build-up or decay of current through circuit components are avoided.

Still another feature of this invention is that clamping circuits are utilized to reduce the magnitude of switching potential and current changes.

Still another feature of this invention relates to means, including an enabling junction transistor, which readies the turn-off operation of the bistable amplifier and which turns the amplifier back on if it has been turned off. The enabling junction transistor is effectively part of the emitter circuit of the point contact transistor to provide for a direct restoring operation at the end of an enabling period.

Further objects and features will become apparent upon consideration of the following description when read in reference to the drawings, wherein.

Figure 1:
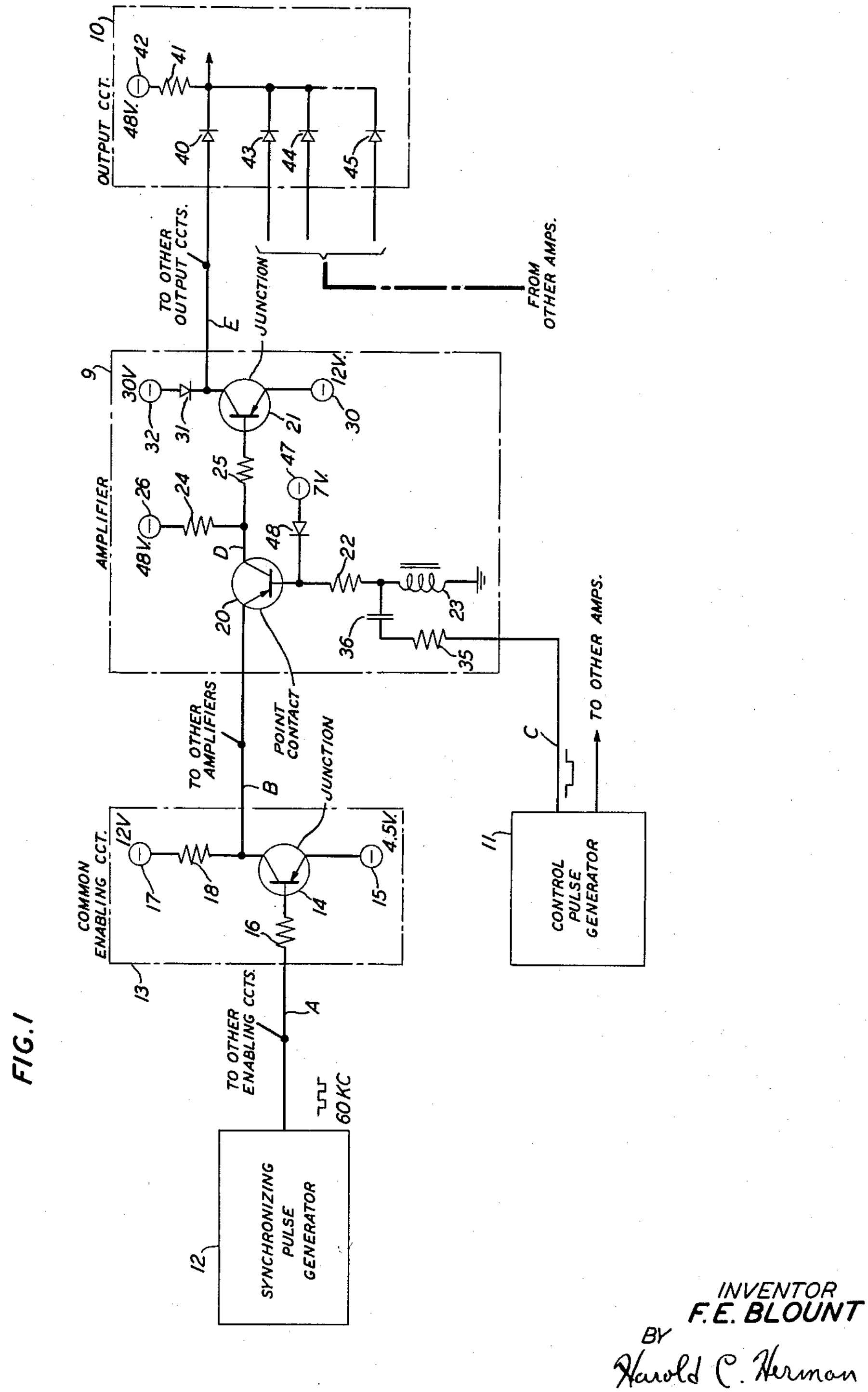
Fig. 1 is a circuit representation of the enabling circuit and amplifier of this invention.

Referring to Fig. 1, the pulse amplifier 9 normally supplies a relatively large output current to the circuit 10. The amplifier 9 can be turned off during an enabling period by the control pulse generator 11. The enabling period is determined under control of a synchronizing pulse generator 12. The amplifier 9 can only be turned off by the generator 11 during the enabling period.

The operating cycle of the circuit shown in Fig. 1 includes the following intervals:

(1) A "disabled" interval;

(2) An "enabling" interval from the time an enabling pulse is provided until a contol pulse is provided;

(3) An "on" interval when the control pulse is provided; and (4) An "off" interval from the end of the control pulse to the end of the enabling pulse.

Figures 2, 3:
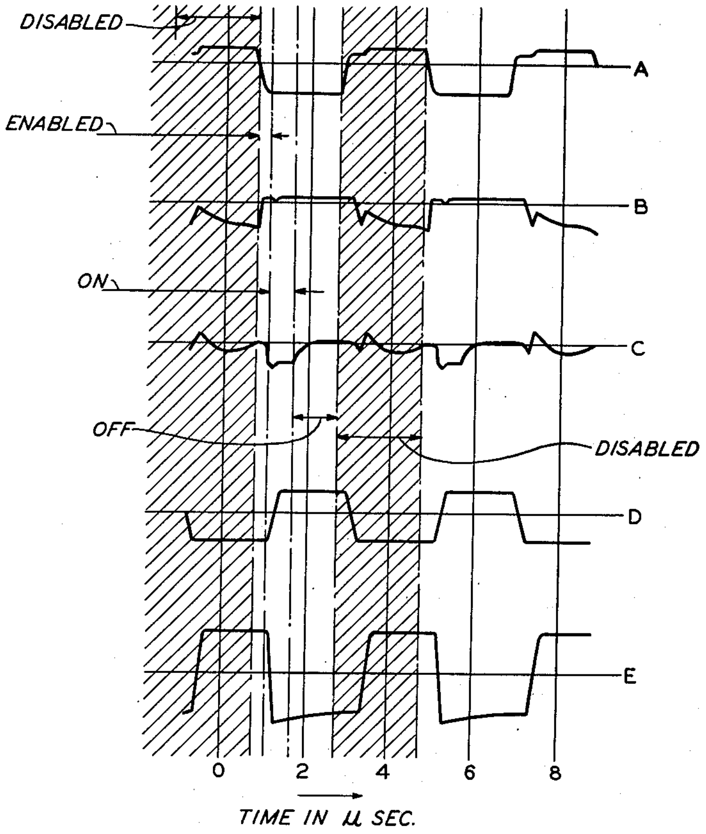
Fig. 2 is a table illustrating the orders of magnitude of the voltage conditions in the circuit representation of Fig. 1.
Fig. 3 is a series of curves illustrating the operation of the enabling circuit and amplifier of this invention.

The voltage conditions at selected points in the circuit, during these four intervals, are tabulated in Fig. 2 and shown as a series of curves in Fig. 3. The voltages listed and discussed are not intended to be limiting but merely illustrative of the orders of magnitude of the switching ranges designed into the exemplary embodiment. For example, at point A, which is at the output of the generator 12, the voltage changes from 0 to minus 10 volts when a pulse is provided from the generator 12. During the disabled, or normal, interval the potential at point A is 0 volts and during the enabled interval the potential is minus 10 volts. The potential conditions at point A are shown as curve A in Fig. 3.

1. *Disabled or normal interval*

The generator 12 supplies the minus 10-volt enabling pulses at a frequency of 60 kilocycles to a number of common enabling circuits 13. Each enabling circuit 13 includes a p-n-p junction transistor which functions as a changeable impedance device to control the operation of a point contact transistor 20 in the amplifier 9. The enabling pulses are provided through a base resistor 16 to the base electrode of the transistor 14. The emitter electrode of transistor 14 is connected to a minus 4.5 volt potential source 15, and the collector electrode of transistor 14 is connected through a resistor 18 to a minus 12-volt potential source 17. The source or battery terminals, not shown in Fig. 1, are connected to ground. With the normal potential at point A at 0 volt, the emitter-to-base junction of transistor 14 is normally reverse biased. With the emitter-to-base junction reversed biased, the collector current is very small and the potential at point B is substantially at minus 12 volts.

The collector electrode of transistor 14 is connected to the emitter electrode of the point contact transistor 20 in a number of amplifiers 9. The junction transistor 14 is therefore essentially part of the emitter circuit of each transistor 20. The potential at the base electrode of transistor 20 is normally at ground potential due to its connection to ground through the serially connected resistor 22 and inductor 23. The emitter electrode of transistor 20 is therefore normally reverse biased with respect to its base electrode.

The resistor 22 functions together with the point contact transistor 20 to provide for a negative resistance characteristic. The base current of transistor 20 is the algebraic sum of its emitter and collector currents, and since the collector current is negative and larger in magnitude than the emitter current when transistor 20 is triggered, the base current is then positive. Therefore, when the transistor 20 is triggered, as is hereinafter described, a positive emitter current results in a positive base current, which by flowing through the base resistor 22, makes the base electrode negative with respect to the emitter electrode. When the base electrode becomes negative with respect to the emitter electrode, the emitter current is further increased inducing thereby an even larger positive base current. It is this regenerative feedback which gives rise to a negative resistance characteristic. It is the combination of the transistor 20 having a current amplification factor greater than one and the feedback promoting base resistor 22 which provides for the negative resistance characteristics.

The emitter circuit of transistor 20, which includes the transistor 14, is designed to have its load line intersect the negative resistance characteristic in three places to provide for bistable operation. The three intersections provide for an "off" or low-current equilibrium condition and an "on" or high-current equilibrium condition. The third intersection provides for an unstable condition. When the emitter potential of transistor 20 is at minus 12 volts, the transistor 20 is in its low-current equilibrium condition. In order to trigger the bistable circuit to its "on" condition, the emitter potential provided from circuit 13 must be increased to minus 4.5 volts and a minus 6-volt control or turn-on pulse must be provided from the generator 11. If a turn-on pulse is provided through resistor 35 and capacitor 36 to the base resistor 22 when the emitter potential is minus 12 volts, the turn-on pulse does not overcome the disabling minus 12-volt bias and transistor 20 remains off. Transistor 20 cannot, therefore, be turned on during the disabled interval.

The collector electrode of transistor 20 is connected to the minus 48-volt potential source 26 through the resistor 24 and also to the base electrode of the p-n-p junction transistor 21 through the base resistor 25. The junction transistor 21 is normally on and supplies a relatively high current to an output circuit 10. The junction transistor 21 is normally on because its emitter-to-base junction is normally forward biased by the minus 12-volt potential source 30 which is connected to its emitter electrode. The potential at point D, which is also the collector electrode of transistor 20, is normally at minus 13.2 volts due to the voltage drop across resistor 24 by the base current of transistor 21 and the small leakage current of transistor 20. With transistor 21 on, the potential at point E, which is the collector electrode of transistor 21, is at minus 12 volts and varistor 31 is reverse biased. Varistor 31, which is poled toward the collector electrode of transistor 21, is connected to the minus 30-volt potential source 32. When transistor 21 is on, therefore, the amplifier 9 supplies the entire collector current of transistor 21 to the output circuit 10.

Utilizing the circuit parameters tabulated below, 11 milliamperes are supplied to source 26, the base current of transistor 21 is 10 milliamperes and the output current is 120 milliamperes. When the amplifier 9 is in its normal condition, it presents an input impedance of only a few ohms to the output, or load, circuit 10. The junction transistor 21 is kept in either its saturated condition, which is its normal condition, or in a cut-off condition, which occurs when a control pulse is provided from generator 11 during the time an enabling pulse is provided from generator 12.

2. *Enabled interval*

When a pulse is provided from the pulse generator 12, the transistor 14 is turned on to raise the emitter potential of the transistor 20. The increase in potential at the emitter electrode of transistor 20 from minus 12 to minus 4.5 volts, however, does not trigger the transistor 20 as the emitter is still reversed biased with respect to the base. The rest of the circuit conditions, including the output current, remain the same.

3. *On interval*

When the control pulse generator 11 provides a 0.5 microsecond control or turn-on pulse during the time an enabling pulse is provided from generator 12, the transistor 20 is triggered to its high-current stable condition. Current must be established in the base circuit of transistor 14 sufficiently in advance of the control pulse to insure triggering. To insure triggering, the enabling pulse must precede the control pulse by approximately 1 microsecond. The control pulse is provided through the resistor 35 and capacitor 36 to the junction between the resistor 22 and inductor 23. The resistor 35 functions as a damper to prevent oscillations due to the reactive effect of inductor 23. The transistor 20 is triggered by the application of a negative pulse of sufficient amplitude to cause the base electrode to become more negative than the emitter electrode. The inductor 23 is utilized in order to obtain a high impedance with pulses having a rise time of the order of .2 microsecond. With a rise time of .2 microsecond, a current of 1 milliampere is required to develop 5 volts across a 1 millihenry inductor. A voltage of approxiamately 5 volts is required at the base electrode in order to trigger the transistor 20 which is biased with minus 4.5 volts at the emitter electrode when transistor 14 is conducting.

The rise of the collector current in a point contact transistor is the result of the presence of minority carriers (holes injected at the emitter for n-type transistor) in the immediate neighborhood of the collector. The minority carriers take a finite length of time to travel from the emitter to the collector, and account for a time delay of the output pulse with respect to the input pulse. The reason for this delay is that all minority carriers do not take the same path in traveling from the emitter to the collector. They do not take the same path because of the geometry of the transistor and the collisions the minority carriers suffer in traveling through the crystal. The minority carriers injected into the emitter at the initiation of the input pulse do not therefore arrive at the collector at the same time. This time spread or delay accounts for the rise time or delay of the output pulse with respect to the input pulse.

The apparent rise time is considerably improved if the transistor 20 is driven to its high-current equilibrium condition by a large input pulse. In addition, the apparent rise time is reduced by increasing the positive feedback. Increasing the feedback functions, therefore, also to effectively overdrive the transistor. Transistor 20 is therefore overdriven by providing a relatively large potential to its base electrode and by utilizing a relatively large base resistor 22. By utilizing a 2-millihenry choke, or inductor 23, the base potential is rapidly increased to a magnitude sufficient to turn on the transistor 20.

When the transistor 20 is turned on, the potential at point D increases from minus 13.2 volts to approximately minus 4.5 volts. The increase in potential at point D to a value more positive than the minus 12-volt potential at the emitter electrode of transistor 21 reverse biases the emitter-to-base junction of transistor 21 causing it to turn off. The current through the resistor 24 to the potential source 26 is not, however, cut off. When the transistor 20 is turned on, the change in potential at point D causes an increase in collector current to the source 26. The current flowing through resistor 24 is not turned completely on or off but is only varied a relatively minor amount when the transistor 20 is switched on. The current to source 26 is switched, therefore, to come from the transistor 20 instead of from the transistor 21. The bias voltage for the emitter-to-base circuit of transistor 20 is applied to its emitter electrode instead of its base electrode in order to keep the potential between its collector electrode and its base electrode to a minimum. A minimum collector-to-base potential keeps the leakage current to a minimum and also decreases the difference in potential at the collector electrode of transistor 20 between the conducting or on condition and the non-conducting or off condition. In this manner, the current from the base electrode of transistor 21 more nearly approaches that of the current from the collector electrode of transistor 20.

When the transistor 20 is turned on, it presents a very small impedance in the base-collector circuit of the transistor 21. When the saturated transistor 21 is turned off, the output current remains constant for a brief interval because of the minority carrier storage. During this interval the stored minority carriers flow at a rate which is limited by the circuit impedance. Not until the minority carrier density in the base layer adjacent the collector junction of transistor 21 has been reduced to zero does the decay of the circuit current commence. By providing a very small impedance in the base circuit of transistor 21, the storage time delay is substantially reduced. In order to have a small base impedance and effectively reduce the storage time delay, the base resistor 25 is small. When the carrier density near the collector junction at transistor 21 approaches zero, the collector junction impedance increases rapidly and the transistor 21 reacts with its active region parameters.

When the transistor 21 reacts with its active region parameters, the potential at point E decreases until it reaches minus 30 volts. When the potential at the collector electrode of the junction transistor 21, which is point E, reaches minus 30 volts the varistor 31 becomes forward biased and the battery 32 clamps the collector potential. The collector potential is clamped partially to prevent the application of minus 48 volts at the collector electrode of transistor 21 when it is turned off. The collector electrode of transistor 21 is connected through the varistor 40 and resistor 41 to the minus 48-volt potential source 42. The source of battery 32 instead of the source 42, in this manner, controls the collector potential when transistor 21 is turned off. If a very large reverse biasing potential were to be applied to the collector electrode of transistor 21, even when the emitter-to-base junction is reverse biased, transistor 21 might break down. Such a transistor breakdown is somewhat similar to the breakdown of a gas tube by large reverse potentials. Varistor 31 functions to prevent such a breakdown.

The varistor 31 and battery 32 also function to reduce the rise time necessary for turning the transistor 21 back on. As is hereinafter described, when transistor 21 is turned on, the collector potential changes only 18 volts from a minus 30-volt potential to about minus 12 volts instead of 36 volts from a minus 48-volt potential to the minus 12 volts. Varistor 31 and battery 32 function therefore to cut the output switching potential difference in half thereby to decrease the time required to turn transistor 21 on.

The resistor 41 in circuit 10 is connected through the varistors 40, 43, 44, 45, etc. to amplifiers 9. If one or more of the amplifiers 9 connected, respectively, to the varistors 43, 44, 45, etc. is supplying an output current, the potential at the junction between varistor 40 and resistor 41 is at minus 12 volts and the varistors 40 and 31 are reversed biased. If, however, the output current of each of the amplifiers 9 connected to the output circuit 10 is simultaneously turned off, the gate varistors 40, 43, 44, 45, etc. are forward biased as well as the varistor 31 in each of the amplifiers 9. In this condition the battery 32 in each of the amplifiers 9, as described above, prevents a breakdown of its associated transistor 21, and provides a current to the output circuit 10 which is limited by the resistor 41.

The output current from amplifier 9 is switched from approximately 120 milliamperes or some lesser value to 0 milliampere. The value of the output current depends upon the condition of the amplifiers 9 connected to varistors 43, 44, 45, etc. If the amplifiers 9 connected to circuit 10 are not supplying current when the current from the amplifier 9, which is connected to varistor 40, is turned off, the output current changes from 120 milliamperes to 0 milliampere and the output voltage changes from minus 12 volts to minus 30 volts. The change in output conditions takes place in less than 1 microsecond.

4. *Off interval*

At the termination of the control pulse from the generator 11, the amplifier 9 remains in its turned-off condition with the transistor 20 conductive and the transistor 21 nonconductive. The amplifier 9 remains turned off because of the bistability of the transistor 20 and its associated circuit components. The transistor 20 provides for bistable operation because its emitter load line as determined by the enabling circuit 13 intersects its negative resistance characteristic in three places. The control pulse, which is of short duration, terminates during the continued occurrence of the enabling pulse from the synchronizing pulse generator 12.

*Return to disabled interval*

The amplifier 9 remains turned off until the termination of the enabling pulse. At the end of the enabling pulse, the potential at point A is returned to 0 volt once again, reverse biasing the emitter-to-base junction of transistor 14. When the transistor 14 is turned off, it presents a very high impedance to the emitter electrode of transistor 20. The potential at point B changes from minus 4.5 volts towards the minus 12-volt potential of source 17. As the emitter potential of transistor 20 decreases, its emitter electrode becomes reverse biased with respect to its base electrode. When the reverse biasing occurs, transistor 20 returns from its high-current equilibrium condition to its low-current equilibrium condition. The potential at its base electrode is clamped by the source 47 which is connected to its base electrode through the varistor 48. When the base potential tends to drop below minus 7 volts, the varistor 48 becomes forward biased. The varistor 48 provides a very low impedance path from source 47 to the base electrode of transistor 20. With the low impedance path connected to the base electrode of transistor 20, the minority carriers are rapidly removed from the collector electrode of transistor 20. The varistor 48 and source 47 function in this manner to reduce the hole storage time of transistor 20. The current from source 47 is through the varistor 48, the base-to-collector path of transistor 20 to resistors 24 and 25. As the potential at point D is changed rapidly from minus 4.5 volts back to minus 13.2 volts, the junction transistor 21 is once again turned on. The current through resistor 24 is continuous, being switched to transistor 21 instead of transistor 20. Reactive effects due to substantial current changes in source 26 and resistor 24 are therefore avoided.

When the junction transistor 21 is turned on, the potential at point E changes from minus 30 volts to minus 12 volts, reverse biasing the varistor 31 and increasing the output current. The potential at point E is increased to minus 12 volts because of the low impedance now presented by the transistor 21 from source 30 to the output circuit 10. The varistor 31 and battery 32 function to reduce the switching potential. Without varistor 31 and battery 32, the collector potential would change from minus 48 volts. The larger the potential change, the longer the switchng interval.

In an illustrative embodiment of this invention the circuit parameters are as follows:

| | |
|---|---|
| Battery 15 | Minus 4.5 volts. |
| Resistor 16 | 820 ohms. |
| Battery 17 | Minus 12 volts. |
| Resistor 18 | 5000 ohms. |
| Resistor 22 | 1000 ohms. |
| Inductor 23 | 2 millihenries. |
| Resistor 24 | 3160 ohms. |
| Resistor 25 | 100 ohms. |
| Battery 26 | Minus 48 volts. |
| Battery 30 | Minus 12 volts. |
| Battery 32 | Minus 30 volts. |
| Resistor 35 | 1000 ohms. |
| Capacitor 36 | 680 micro-microfarads. |
| Resistor 41 | 300 ohms. |
| Battery 42 | Minus 48 volts. |

What is claimed is:

1. In combination, a plurality of point contact transistors, each having a semiconductive body and emitter, base and collector connections to said body; means including a first junction transistor for biasing said emitter connection of all of said point contact transistors, said first junction transistor including a collector connected to said emitter connection of all of said point contact transistors; means including individually associated potential sources connected for biasing in a reverse direction said collector connection of each of said point contact transistors; means connected to said first junction transistor for changing the conductive condition of said first junction transistor to change the emitter biasing of all of said point contact transistors; a plurality of normally conductive second junction transistors individually associated with each of said point contact transistors, each of said second junction transistors having a semiconductive body and emitter, base and collector connections to said body; biasing means connected to said emitter electrode of each of said second junction transistors; circuit means directly connecting said base connection of each of said second junction transistors to the associated one of said sources and to said collector connection of the associated one of said point contact transistors; means for supplying a turn-on pulse to said base connection of selected ones of said point contact transistors, and a plurality of output connections individually connected to said collector connections of said second junction transistors.

2. An amplifier which comprises a point contact transistor having a semiconductor body and emitter, base and collector electrodes; means including a first potential source connected to said collector electrode for normally maintaining said point contact transistor in a reverse biased state; an impedance element connected to said base electrode of said point contact transistor for providing therewith for a low conduction and a high conduction state of operation; a first junction transistor having a semiconductor body and emitter, base and collector electrodes; a source of constant potential connected to said emitter electrode of said junction transistor; biasing means including a second potential source connected to said emitter electrode of said point contact transistor and to said collector electrode of said first junction transistor; means connected to said base electrode of said first junction transistor for changing the conductive condition thereof so as to change the emitter biasing of said point contact transistor; a normally conductive second junction transistor having a semiconductive body and emitter, base and collector electrodes; biasing means connected to said emitter and said base electrodes of said second junction transistor; and means devoid of frequency sensitive coupling elements directly coupling said base electrode of said second junction transistor to said first potential source and to said collector electrode of said point contact transistor whereby said second junction transistor is rendered nonconductive upon conduction in said point contact transistor and conductive upon nonconduction in said point contact transistor.

3. A pulse amplifier for switching a substantial current at high speed comprising a junction transistor having a base electrode and an emitter-collector circuit, load means connected to said emitter-collector circuit, a potential source connected to said base electrode for normally maintaining said junction transistor in a forward biased state, circuit means connected to said base electrode of said junction transistor for reducing carrier storage effects upon said junction transistor becoming reverse biased, said circuit means including a normally nonconducting point contact transistor having an emitter, base and collector electrode, means devoid of frequency sensitive coupling elements directly coupling said collector electrode of said point contact transistor with said base electrode of said junction transistor, feedback impedance means connected to said base electrode of said point contact transistor to provide therewith for a low-current and a high-current state of operation, and transfer means connected to said emitter electrode of said point contact transistor for determining the state of operation of said point contact transistor whereby the operation of said point contact transistor in said high-current state provides a low impedance path from said potential source, said low impedance path being in a shunt relationship to the emitter-base junction of said junction transistor.

4. An electrical circuit comprising a first transistor having a base, emitter and collector, biasing means connected to said base, said emitter and said collector of said first transistor for normally maintaining the first transistor in a conductive condition, said biasing means including a source of current connected to said base electrode of said first transistor, transistor circuit means for switching the current from said source from said first transistor whereby the collector current in said first transistor is rapidly reduced, said transistor circuit means including a second transistor having a base, emitter and collector, means connected to said base, said emitter and said collector of said second transistor to define therewith a bistable circuit, means devoid of frequency sensitive coupling elements for directly coupling said collector of said second transistor to said base of said first transistor, and means for transferring the operational state of said second transistor.

5. An electrical circuit comprising a first transistor having a base, emitter and collector, biasing means connected to said base, said emitter and said collector of said first transistor for normally maintaining the first transistor in a conductive condition, said biasing means including a source of current connected to said base electrode of said first transistor, transistor circuit means for switching the current from said source from said first transistor whereby the collector current in said first transistor is rapidly reduced, said transistor circuit means including a second transistor having a base, emitter and collector, means connected to said base, said emitter and said collector of said second transistor to define therewith a bistable circuit, means devoid of frequency sensitive coupling elements for directly coupling said collector of said second transistor to said base of said first transistor, means for transferring the operational state of said second transistor wherein said second transistor is a point contact transistor and said transferring means includes a third transistor having a base-electrode and an emitter-collector circuit directly connected to said emitter of said second transistor enabling said second transistor, and a pulse source cooperative with said third transistor for controlling the operational state of said second transistor.

6. An electrical circuit comprising a first transistor having a base, emitter and collector, biasing means connected to said base, said emitter and said collector of said first transistor for normally maintaining the first transistor in a conductive condition, said biasing means including a source of current connected to said base electrode of said first transistor, transistor circuit means for switching the current from said source from said first transistor whereby the collector current in said first transistor is rapidly reduced, said transistor circuit means including a second transistor having a base, emitter and collector, means connected to said base, said emitter and said collector of said second transistor to define therewith a bistable circuit, means devoid of frequency sensitive coupling elements for directly coupling said collector of said second transistor to said base of said first transistor, means for transferring the operational state of said second transistor wherein said first transistor is of a junction type and said second transistor is of a point contact type.

7. A pulse amplifier for switching a substantial current at high speed comprising a junction transistor having a base, emitter and collector, biasing means connected to said base, said emitter and said collector for normally maintaining said junction transistor in a conductive condition, said biasing means including a source of current connected to said base electrode of said junction transsistor, a current multiplication transistor having a base, emitter and collector, a feedback promoting impedance connected to said base electrode of said current multiplication transistor, means devoid of frequency sensitive coupling elements for directly coupling said collector electrode of said current multiplication transistor to said base electrode of said junction transistor, an emitter circuit connected to said emitter electrode of said current multiplication transistor for providing with said feedback impedance and said current multiplication transistor for a low current and a high current state of operation, said emitter circuit including a potential source and a changeable impedance device connected to said emitter electrode having both a low impedance condition for enabling a transfer of operation of said current multiplication transistor from said low-current state to said high-current state and a high impedance condition for transferring the operation of said current multiplication transistor from said high-current state to said low-current state if it is at said high-current state of operation, and means connected to said emitter circuit for changing the impedance condition of said changeable impedance device.

8. A pulse amplifier in accordance with claim 7 comprising in addition means connected to said base electrode of said current multiplication transistor means and effective after said transistor is enabled for changing the transistor equilibrium condition from said low-current condition to said high-current condition.

9. An electrical circuit comprising a first transistor having a base, emitter and collector, biasing means connected to said base, said emitter and said collector of said first transistor for normally maintaining said first transistor in a conductive condition, said biasing means including a source of current connected to said base electrode for supplying a predetermined base current to said first transistor, transistor circuit means for switching a current substantially equal to said predetermined base current from said source from said first transistor, said transistor circuit means including a second transistor having a base, emitter and collector, means devoid of frequency sensitive coupling elements directly coupling said collector of said second transistor to said base of said first transistor, and means connected to said emitter and said base of said second transistor for determining collector current flow through said second transistor substantially equal to said switched current whereby collector current flow through said first transistor is rapidly reduced.

10. An electrical circuit comprising a transistor having a base, emitter and collector, biasing means connected to said base, said emitter and said collector for normally maintaining said transistor device in a conductive condition, said biasing means including a source of current connected to said base electrode for supplying a predetermined base current to said transistor device, variable impedance means directly coupled to said base electrode and to said source of current for providing a low impedance path for said predetermined amount of current during a low impedance condition whereby the current supplied by said source is maintained substantially constant, and means for varying the impedance condition of said variable impedance means.

References Cited in the file of this patent

UNITED STATES PATENTS

| | | |
|---|---|---|
| 2,622,213 | Harris | Dec. 16, 1952 |
| 2,670,445 | Felker | Feb. 23, 1954 |
| 2,705,287 | Lo | Mar. 29, 1955 |
| 2,708,720 | Anderson | May 17, 1955 |
| 2,730,576 | Caruthers | Jan. 10, 1956 |
| 2,751,550 | Chase | June 19, 1956 |
| 2,776,382 | Jensen | Jan. 1, 1957 |
| 2,827,574 | Schneider | Mar. 18, 1958 |
| 2,831,113 | Weller | Apr. 15, 1958 |
| 2,849,626 | Klapp | Aug. 26, 1958 |
| 2,871,376 | Kretzmer | Jan. 27, 1959 |
| 2,901,639 | Woll | Aug. 25, 1959 |

OTHER REFERENCES

Chaplin et al.: "A Transistor Digital Fast Multiplier With Magnetostrictive Storage," Proc. of the I.E.E. (part B), vol. 102, No. 4, July 1955, pp. 412–425 (Fig. 8, p. 415).